United States Patent
Sung et al.

(10) Patent No.: US 9,768,302 B2
(45) Date of Patent: Sep. 19, 2017

(54) SEMICONDUCTOR STRUCTURE AND FABRICATING METHOD THEREOF

(71) Applicant: TAIWAN SEMICONDUCTOR MANUFACTURING CO., LTD., Hsinchu (TW)

(72) Inventors: Hsueh-Chang Sung, Hsinchu County (TW); Chih-Chiang Chang, Hsinchu County (TW); Kun-Mu Li, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/871,454

(22) Filed: Sep. 30, 2015

(65) Prior Publication Data

US 2017/0092768 A1  Mar. 30, 2017

(51) Int. Cl.
*H01L 29/78* (2006.01)
*H01L 21/02* (2006.01)
*H01L 29/165* (2006.01)
*H01L 29/66* (2006.01)

(52) U.S. Cl.
CPC .... *H01L 29/7849* (2013.01); *H01L 21/02532* (2013.01); *H01L 29/165* (2013.01); *H01L 29/66795* (2013.01); *H01L 29/7851* (2013.01)

(58) Field of Classification Search
CPC ............ H01L 29/7849; H01L 29/165; H01L 21/02532; H01L 29/7851; H01L 29/66795
USPC ........................................................ 257/191
See application file for complete search history.

(56) References Cited

U.S. PATENT DOCUMENTS

| | | | | |
|---|---|---|---|---|
| 2004/0178406 A1* | 9/2004 | Chu | ................. | H01L 21/02381 257/19 |
| 2013/0105861 A1* | 5/2013 | Liao | ................... | H01L 29/7848 257/192 |
| 2015/0179795 A1* | 6/2015 | Kim | ................. | H01L 29/66477 257/408 |

* cited by examiner

*Primary Examiner* — Fernando L. Toledo
*Assistant Examiner* — Adam S Bowen
(74) *Attorney, Agent, or Firm* — Maschoff Brennan

(57) ABSTRACT

A semiconductor structure and a method of fabricating the semiconductor structure are disclosed herein. The semiconductor structure includes a substrate, a strain-inducing layer and an epitaxy structure. The strain-inducing layer is disposed on the substrate, and the epitaxy structure is embedded in the strain-inducing layer and not in contact with the substrate.

20 Claims, 6 Drawing Sheets

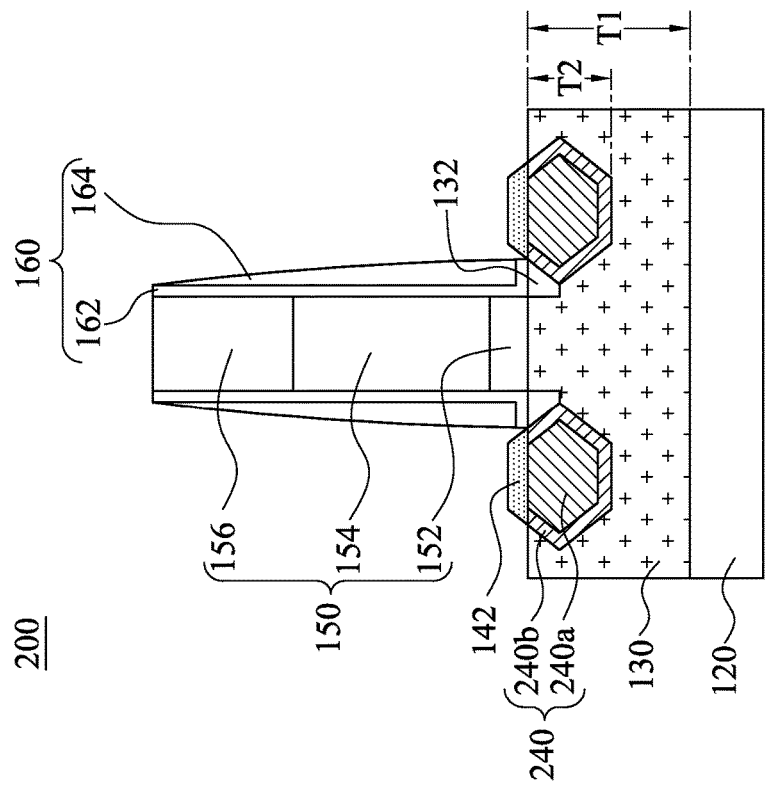
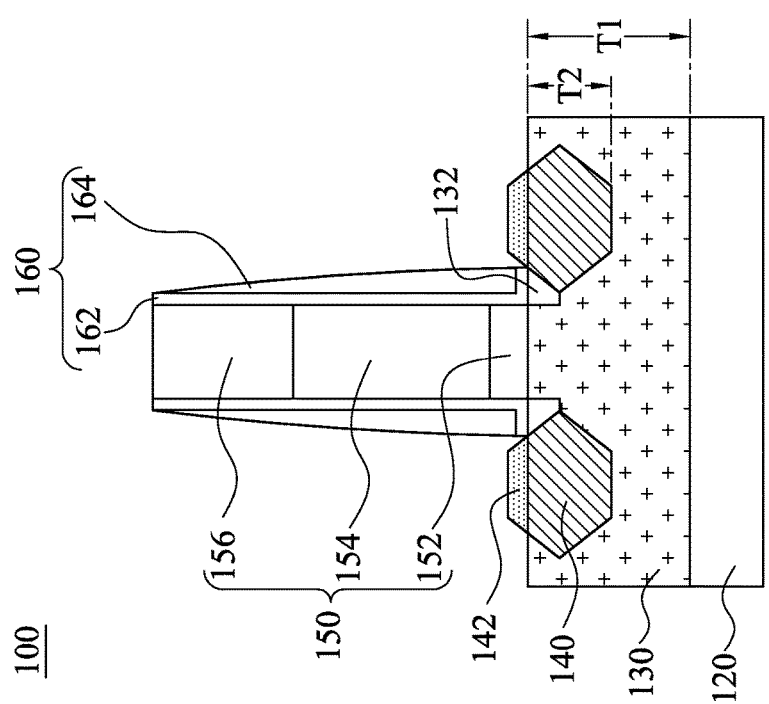
Fig. 1B
Fig. 1C

SEMICONDUCTOR STRUCTURE AND FABRICATING METHOD THEREOF

BACKGROUND

Manufacturing of an integrated circuit (IC) has been largely driven by the need to increase the density of the integrated circuit formed in a semiconductor device. This is typically accomplished by implementing more aggressive design rules to allow larger density of IC device to be formed. Nonetheless, the increased density of the IC devices, such as transistors, has also increased the complexity of processing semiconductor devices with the decreased feature sizes.

For example, as semiconductor devices, such as metal-oxide-semiconductor field-effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often implements epitaxially grown silicon (Si) to form raised source and drain features for an n-type device, and epitaxially growing silicon germanium (SiGe) to form raised source and drain features for a p-type device. In the manufacturing process of stressors, further improvements are constantly necessary to satisfy the performance requirement in the scaling down process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B is a cross-sectional view of the semiconductor structure in FIG. 1A along the line AA, in accordance with various embodiments.

FIG. 1C is a cross-sectional view of a semiconductor structure, in accordance with various embodiments.

DETAILED DESCRIPTION

Figure 1A:
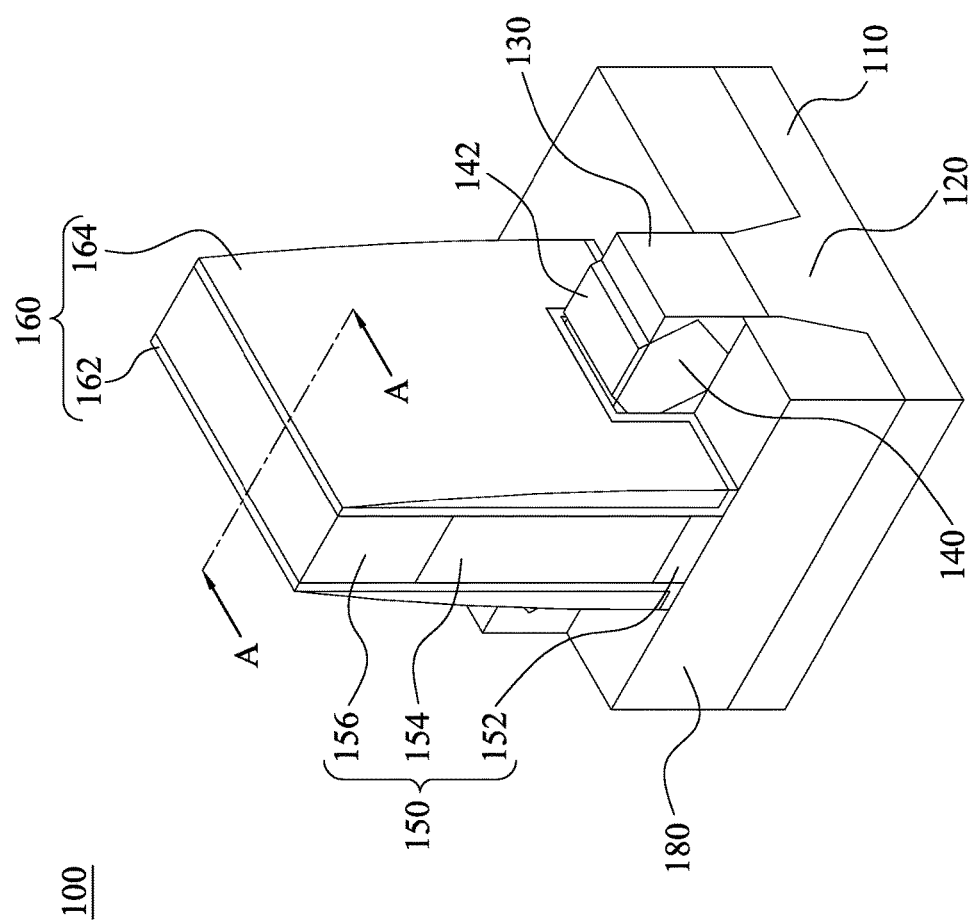
FIG. 1A is a semiconductor structure in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, a strain-inducing layer is applied on a substrate to function as a channel region of a MOSFET, and stressors are formed in the strain-inducing layer to enhance carrier mobility and improve device performance. These stressors are desired to have larger volume to increase the strain of the channel region. However, it is noticed that if the stressors penetrating the strain-inducing layer and contacting the underlying substrate, enormous loss of strain is occurred, which results in decreasing of the carrier mobility in the channel region. In this concern, a semiconductor structure and a fabricating method thereof are necessary to maintain the strain of the strain-inducing layer.

FIG. 1A is a semiconductor structure in accordance with various embodiments of the present disclosure, and FIG. 1B is a cross-sectional view of the semiconductor structure in FIG. 1A along the line AA, in accordance with various embodiments. A semiconductor structure 100 is described in FIGS. 1A and 1B, which may include passive components such as resistors, capacitors, inductors, and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is further understood that additional features may be added in the semiconductor structure 100, and some of the features described below may be replaced or eliminated, for additional embodiments of the semiconductor structure 100.

As shown in FIGS. 1A and 1B, the semiconductor structure 100 includes a substrate 110, a fin structure 120, a strain-inducing layer 130, an epitaxy structure 140, and a gate structure 150. The fin structure 120 is formed from the substrate 110, and the strain-inducing layer 130 having a thickness T1 is disposed on the fin structure 120. It is worth noting that the substrate 110 (or the fin structure 120) and the strain-inducing layer 130 are formed of different materials having different lattice constants and energy bandgaps, and atoms in the strain-inducing layer 130 are rearranged to align with atoms in the underlying substrate 110. Therefore, the links between the atoms in the strain-inducing layer 130 may be stretched or compressed to induce the strain, and thus improves carrier mobility of the semiconductor structure 100 during operation. In some embodiments, the substrate 110 may include an elementary semiconductor including silicon or germanium in crystal, polycrystalline, and/or an amorphous structure. In various embodiments, the substrate 110 may include a compound semiconductor including silicon carbide, gallium arsenic, gallium phosphide, indium phosphide, indium arsenide, and/or indium antimonide. In various embodiments, the substrate 110 may include an alloy semiconductor including SiGe, GaAsP, AlInAs, AlGaAs, GaInAs, GaInP, and/or GaInAsP; any other suitable material; and/or combinations thereof.

The strain-inducing layer 130 further includes lightly doped source/drain (LDD) regions 132 depending on design requirements (e.g., p-type wells or n-type wells). In some embodiments, these doped regions are doped with p-type dopants, such as boron or BF2, to form the p-typed lightly doped source/drain (PLDD). In some embodiments, these doped regions are doped with n-type dopants, such as phosphorus or arsenic, to form the n-typed lightly doped source/drain (NLDD).

The epitaxy structure 140 is embedded in the strain-inducing layer 130 and not in contact with the substrate 110 (or the fin structure 120). Therefore, the epitaxy structure 140 breaking the rearrangement of the atoms at an interface between the strain-inducing layer 130 and the substrate 110 is avoided, and thus maintaining the strain of the strain-inducing layer 130. In addition, a thickness T2 of epitaxy structure 140 affects the strain in the strain-inducing layer 130. Larger thickness T2 increases a volume of the epitaxy structure 140 to induce the strain, but the thickness T2 is smaller than the thickness T1 of the strain-inducing layer 130. As such, the epitaxy structure 140 is not in contact with the interface between the strain-inducing layer 130 and the substrate 110 to prevent the loss of strain in the strain-inducing layer 130. In some embodiments, the thickness T2 of the epitaxy structure 140 is in a range from about 50% to 80% of the thickness T1 of the strain-inducing layer 130. In various embodiments, the thickness T1 of the strain-inducing layer 130 is in a range from about 40 nm to about 60 nm, and the thickness T2 of the epitaxy structure is in a range from about 20 nm to about 50 nm.

In some embodiments, the semiconductor structure 100 includes a P-channel field effect transistor (PFET) device, which the substrate 110 (or the fin structure 120) is a silicon substrate, and the strain-inducing layer 130 is a germanium-containing layer including germanium (Ge), silicon germanium (SiGe), or a combination thereof. A lattice constant of germanium or silicon germanium is larger than a lattice constant of silicon, so the crystal lattice of germanium or silicon germanium is compressed to increase the strain, resulting in higher hole mobility during operation of the PFET device. The epitaxy structure 140 is embedded in the germanium-containing layer and above an interface between the silicon substrate and the germanium-containing layer, so as to maintain the rearrangement of the atoms at the interface and preserve the strain of the germanium-containing layer.

In some embodiments, the semiconductor structure 100 is a N-channel field effect transistor (NFET) device. The substrate 110 (or the fin structure 120) is a germanium-containing substrate including germanium (Ge), silicon germanium (SiGe), or a combination thereof, and the strain-inducing layer 130 is a silicon layer. A lattice constant of silicon is smaller than a lattice constant of germanium or silicon germanium, so the crystal lattice of silicon is stretched to increase the strain, resulting in higher electron mobility during operation of the NFET device. The epitaxy structure 140 is embedded in the silicon layer and above an interface between the germanium-containing substrate and the silicon layer, so as to maintain the rearrangement of the atoms at the interface and preserve the strain of the silicon layer.

In some embodiments, the strain-inducing layer 130 and the epitaxy structure 140 includes germanium (Ge), silicon germanium (SiGe), or a combination thereof. In various embodiments, the strain-inducing layer 130 and the epitaxy structure 140 are both formed of silicon germanium, and the silicon germanium of the epitaxy structure 140 is higher than the silicon germanium of the strain-inducing layer 130 in germanium percentage. The silicon germanium of the strain-inducing layer 130 has a germanium percentage in a range from about 30 to about 50%, and the silicon germanium of the epitaxy structure 140 has a germanium percentage greater than about 50%.

In some other embodiments, the semiconductor structure 100 further includes a cap layer 142 on the epitaxy structure 140 to protect the underlying epitaxy structure 140 from damage during the subsequent exposing and etching process. The cap layer 142 is also formed of silicon germanium, and the silicon germanium of the epitaxy structure 140 is higher than the silicon germanium of the cap layer 142 in germanium percentage. The silicon germanium of the cap layer 142 has a germanium percentage in a range from about 20 to about 50%.

The semiconductor structure 100 further includes a gate structure 150 on and across the strain-inducing layer 130 for the PFET device and/or the NFET device, and two epitaxy structures 140 are interposed by the gate structure 150. In addition, the LDD regions 132 are substantially aligned with the sidewalls of the gate structure 150. In some embodiments, the gate structure 150 includes, in order, a gate dielectric layer 152, a gate electrode 154, and a hard mask 156. The gate dielectric layer 152 is disposed on the strain-inducing layer 130 and includes a dielectric material, such as silicon oxide, silicon oxynitride, silicon nitride, a high-k dielectric material, other suitable dielectric material, or combinations thereof. Exemplary high-k dielectric materials include $HfO_2$, HfSiO, HfSiON, HfTaO, HfTiO, HfZrO, other suitable materials, or a combination thereof.

In various embodiments, the gate dielectric layer 152 is a multilayer structure, for example, including an interfacial layer, and a high-k dielectric material layer on the interfacial layer. An exemplary interfacial layer may be a grown silicon oxide layer formed by a thermal process or an atomic layer deposition (ALD) process.

The gate electrode 154 is disposed on the gate dielectric layer 152. In some embodiments, the gate electrode 154 is formed of polycrystalline silicon (polysilicon), and the polysilicon is doped for proper conductivity. Alternatively, the polysilicon is not necessarily doped if a dummy gate is to be formed and replaced in a subsequent metal gate replacement process. In various embodiments, the gate electrode 154 includes conductive materials having a proper work function, which is also referred as a work function layer. The work function layer includes any suitable material, such that the layer is tuned to have a proper work function for enhanced performance of the associated device. For example, if a p-type work function metal for the PFET device is desired, TiN or TaN is used to prepare the work function layer. On the other hand, if an n-type work function metal for the NFET device is desired, Ta, TiAl, TiAlN, or TaCN is used to prepare the work function layer. In various embodiments, the gate electrode 154 includes other conductive materials, such as aluminum, copper, tungsten, metal alloys, metal silicide, other suitable materials, or a combination thereof. Specifically, the gate electrode 154 includes the work function layer and another conductive layer on the work function layer.

The hard mask 156 is disposed on and protecting the gate electrode 154. In some embodiments, the hard mask 156 includes silicon oxide, silicon nitride, silicon oxynitride, silicon carbide, other suitable dielectric material, or combinations thereof. In various embodiments, the hard mask 156 is a multi-layer structure.

Continuing in FIGS. 1A and 1B, gate spacers 160 are overlying opposite sidewalls of the gate structure 150, and each of the gate spacer 160 includes a first spacer 162 and a second spacer 164. In some embodiments, the first spacer 162 includes dielectric material, such as silicon oxide or silicon nitride. In some embodiments, the first spacer 162 has a thickness of less than approximately 60 angstroms. In some embodiments, the second spacer 164 includes dielectric material, such as silicon nitride, but not limited thereto. Other exemplary compositions include silicon oxide, silicon carbide, silicon oxynitride, combinations thereof, and/or other suitable materials are also suitable for the second spacer 164. In some embodiments, the second spacer 164 has a thickness less than approximately 600 angstroms. In various embodiments, the first spacer 162 is also referred as a liner having a profile of L-shape as shown in FIGS. 1A and 1B, but not limited thereto. In various embodiments, the second spacer 164 has a profile of D-shape as shown in FIGS. 1A and 1B, but not limited thereto.

In some embodiments, the semiconductor structure 100 further includes an isolation structure 180 disposed between the two adjacent ones of the fin structures 120. In other words, the isolation structure 180 separates and electrically isolates the adjacent fin structures 120. In various embodiments, the isolation structure 180 includes silicon oxide, silicon nitride, spin-on glass, combination thereof, or other suitable material.

Figure 2B:
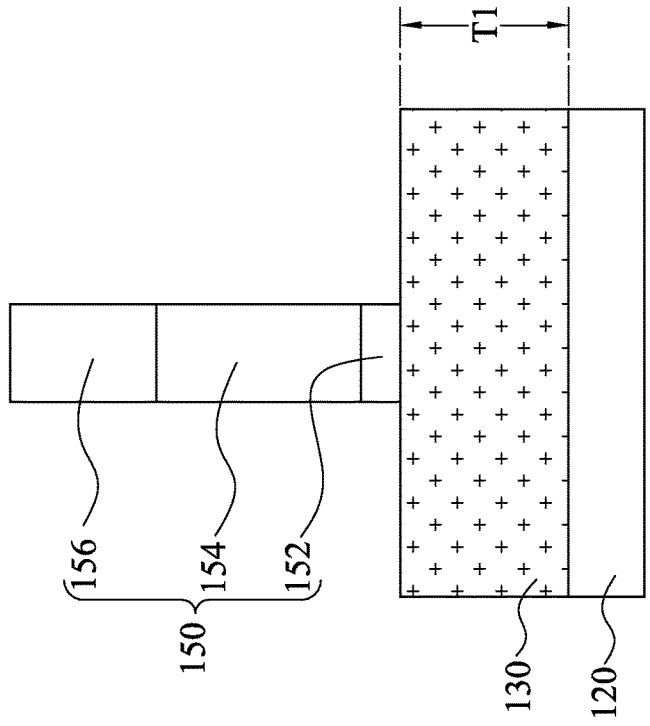
FIG. 2A to 2F are cross-sectional views of the semiconductor structure in FIG. 1A along the line AA at an intermediate stage of fabrication, in accordance with various embodiments.

Referring now to FIG. 1C. FIG. 1C is a cross-sectional view of a semiconductor structure 200, in accordance with various embodiments. The difference between the semiconductor structure 100 in FIG. 1B and the semiconductor structure 200 in FIG. 1C are described below. The semiconductor structure 200 includes an epitaxy structure 240 embedded in the strain-inducing layer 130 without contacting the substrate 110 (or the fin structure 120). Therefore, the epitaxy structure 240 breaking the rearrangement of the atoms at an interface between the strain-inducing layer 130 and the substrate 110 is avoided, and thus maintaining the strain of the strain-inducing layer 130. The epitaxy structure 240 in FIG. 2C is a bi-layer structure including a first portion 240*a* and a second portion 240*b*. The second portion 240*b* surrounds the first portion 240*a* and contacts the strain-inducing layer 130, which the second portion 240*b* functions as a buffer layer to prevent or reduce defects formed between the strain-inducing layer 130 and the second portion 240*b*, therefore the second portion 240*b* prevents strain relaxation and dislocation between epitaxy structure 240 and the strain-inducing layer 130.

In some embodiments, the epitaxy structure 240 and the strain-inducing layer 130 are both formed of silicon germanium. The silicon germanium of the second portion 240*b* of the epitaxy structure 240 is higher than the silicon germanium of the strain-inducing layer 130 in germanium percentage, and the silicon germanium of the first portion 240*a* of the epitaxy structure 240 is higher than the silicon germanium of the second portion 240*b* of the epitaxy structure 240 in germanium percentage. In other words, the germanium percentage of the second portion 240*b* is between that of the first portion 240*a* and the strain-inducing layer 130. As such, the second portion 240*b* buffers the lattice mismatch between the first portion 240*a* and the strain-inducing layer 130, so as to prevent current leakage during the operation of the semiconductor structure 200. In various embodiments, the second portion 240*b* of the epitaxy structure 240 is lower than the silicon germanium of the strain-inducing layer 130 in germanium percentage.

To be noticed, although the epitaxy structure 240 illustrated in FIG. 1C is the bi-layer structure, other multi-layer structures are also suitable without departing from the spirit of the present disclosure. In some embodiments, the epitaxy structure 240 is a multi-layer having three portions, four portions, etc, and the silicon germanium of the epitaxy structure 240 is gradiently increased in germanium percentage from an interface between the epitaxy structure 240 and the strain-inducing layer 130 to a top surface of the epitaxy structure 240. In various embodiments, the epitaxy structure 240 is a continuous structure having a germanium percentage gradually increased from an interface between the epitaxy structure 240 and the strain-inducing layer 130 to a top surface of the epitaxy structure 240.

According to some embodiments, a method of fabricating a semiconductor structure 100 is provided. FIG. 2A to 2F are cross-sectional views of the semiconductor structure 100 in FIG. 1A along the line AA at an intermediate stage of fabrication, in accordance with various embodiments. It worthy noting that additional steps may be provided before, during, and/or after the method, and some of the steps described below may be replaced or eliminated, for additional embodiments of the method.

Figure 2A:
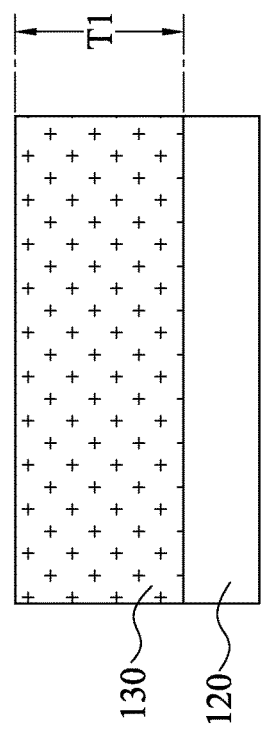

In FIG. 2A, a strain-inducing layer 130 is formed on a substrate 110 (or a fin structure 120), and the strain-inducing layer 130 has a thickness T1 in a range from about 40 nm to about 50 nm. Because a lattice constant of the strain-inducing layer 130 is different from a lattice constant of the substrate 110, atoms in the strain-inducing layer 130 are rearranged to align with atoms in the underlying substrate 110 (fin structure 120), and thus inducing the strain in the strain-inducing layer 130. In some embodiments, the substrate 110 is a silicon substrate, and the strain-inducing layer 130 is a germanium-containing layer including germanium (Ge), silicon germanium (SiGe), or a combination thereof. The germanium-containing layer is formed on the silicon substrate by an epitaxy process using a Si-containing gas (e.g., silane or dichlorosilane (DCS)), a Ge-containing gas (e.g., $GeH_4$, $GeCl_4$), a carrier gas (e.g., $H_2$), and/or a selective etching gas (e.g., HCl). The epitaxy process is performed under a temperature ranging between about 500° C. and about 800° C., and under a pressure ranging between about 10 Torr and about 100 Torr.

In various embodiments, the substrate 110 (or the fin structure 120) is a germanium-containing substrate including germanium (Ge), silicon germanium (SiGe), or a combination thereof, and the strain-inducing layer 130 is a silicon layer. The silicon layer is formed on the germanium-containing substrate by an epitaxy process using a Si-containing gas (e.g., silane or dichlorosilane (DCS)), a carrier gas (e.g., $H_2$), and/or a selective etching gas (e.g., HCl). The epitaxy process is performed under a temperature ranging between about 500° C. and about 800° C., and under a pressure ranging between about 10 Torr and about 100 Torr.

Continuing in FIG. 2B, a gate structure 150 is formed on and cross the strain-inducing layer 130. In this step, a gate dielectric layer 152, a gate electrode 154, and a hard mask 156 are subsequently formed on the strain-inducing layer 130 by a deposition process, such as chemical vapor deposition (CVD), physical vapor deposition (PVD), atomic layer deposition (ALD), thermal oxidation, other suitable techniques, or a combination thereof. Then, the gate dielectric layer 152, the gate electrode 154, and the hard mask 156 are patterned to form the gate structure 150 covering a top surface and sidewalls of the strain-inducing layer 130. In other words, the strain-inducing layer 130 functions as a channel when a voltage is applied to the gate structure 150. In some embodiments, the patterning process further includes lithography process and etching process. The lithography process includes photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching).

Continuing in FIG. 2C, lightly doped source/drain (LDD) regions 132 are formed in the strain-inducing layer 130 and on the opposite sides of the gate structure 150. In some embodiments, the LDD regions 132 are substantially aligned with the sidewalls of the gate structure 150. The LDD regions 132 may be formed using ion implantation, plasma-based ion implantation, gaseous or solid source thermal diffusion, deposition, or combinations thereof. In some embodiments, the LDD regions 132 are doped with p-type dopant, such as boron and/or BF2, for the PFET device. In some other embodiments, the LDD regions 132 are doped with n-type dopant, such as phosphorous and/or arsenic, for the NFET device.

Figure 2D:
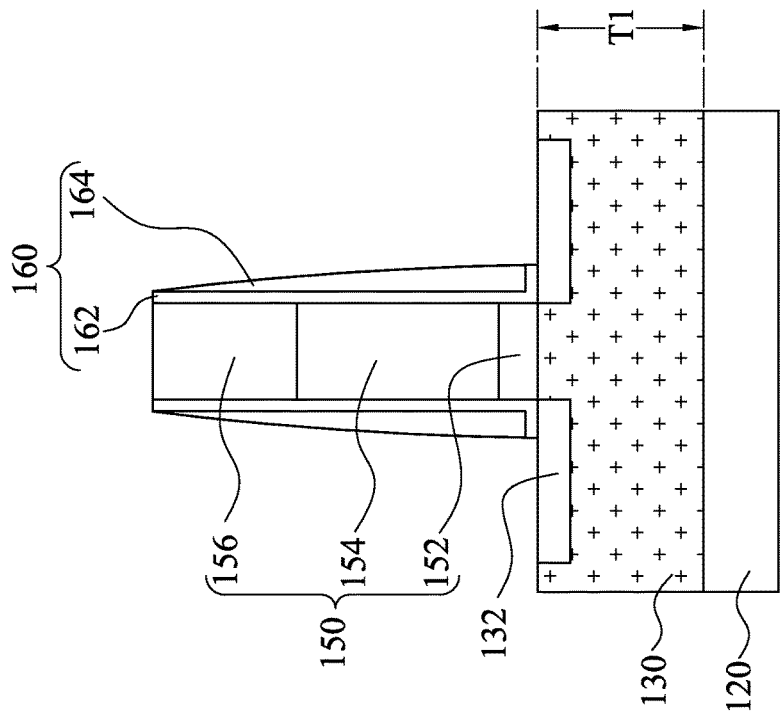
Figure 2C:
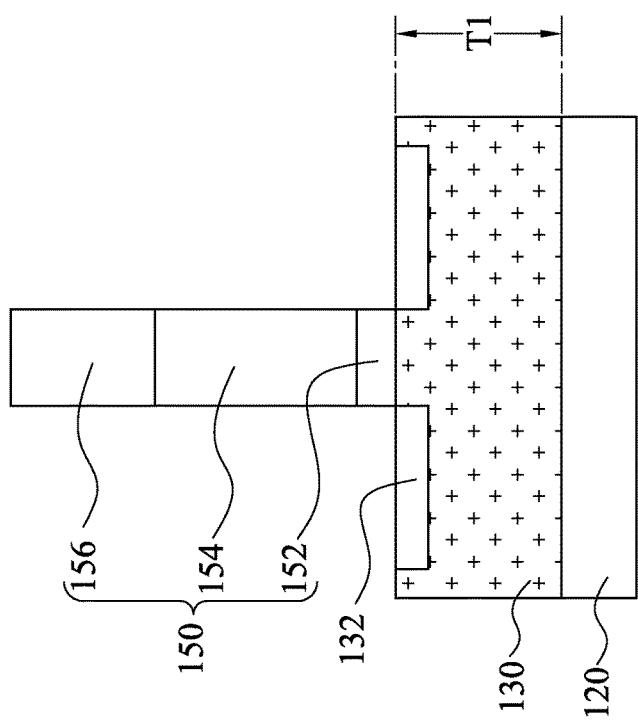

Continuing in FIG. 2D, gate spacers 160 are formed on opposite sidewalls of the gate structure 150. As shown in FIG. 2D, each of the gate spacer 160 includes a first spacer 162 and a second spacer 164. In some embodiments, the first spacer 162 and the second spacer 164 are formed in different processes. For example, the first spacer 162 is formed by plasma-enhanced chemical vapor deposition (PECVD) and/or other suitable processes, and the second spacer 164 is formed by physical vapor deposition (PVD) (i.e., sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other suitable processes. Then, the first spacer 162 and the second spacer 164 are partially removed such that the second spacer 164 with a D-shaped profile and the first spacer 162 with an L-shaped profile are formed.

Figure 2F:
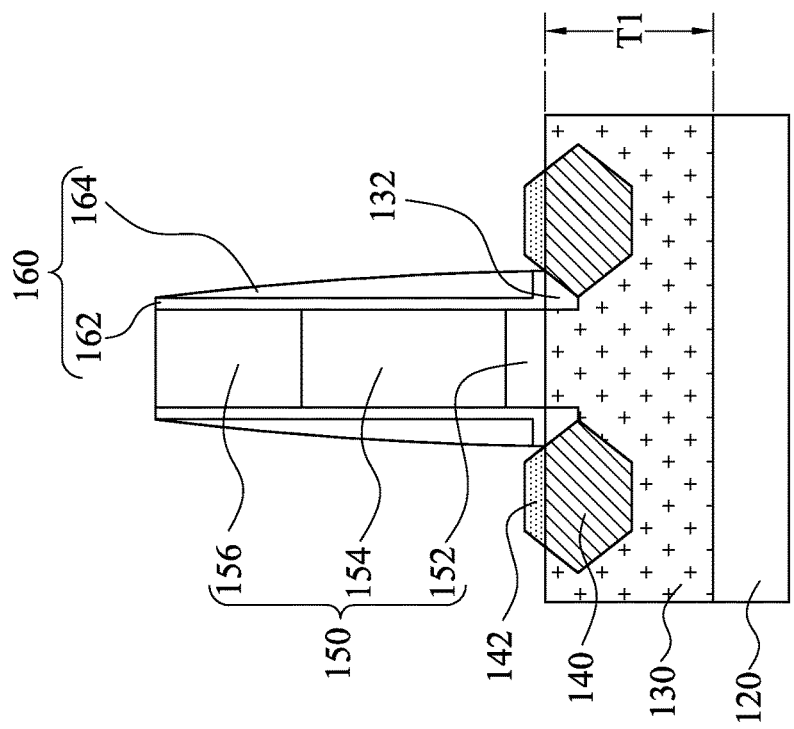
Figure 2E:
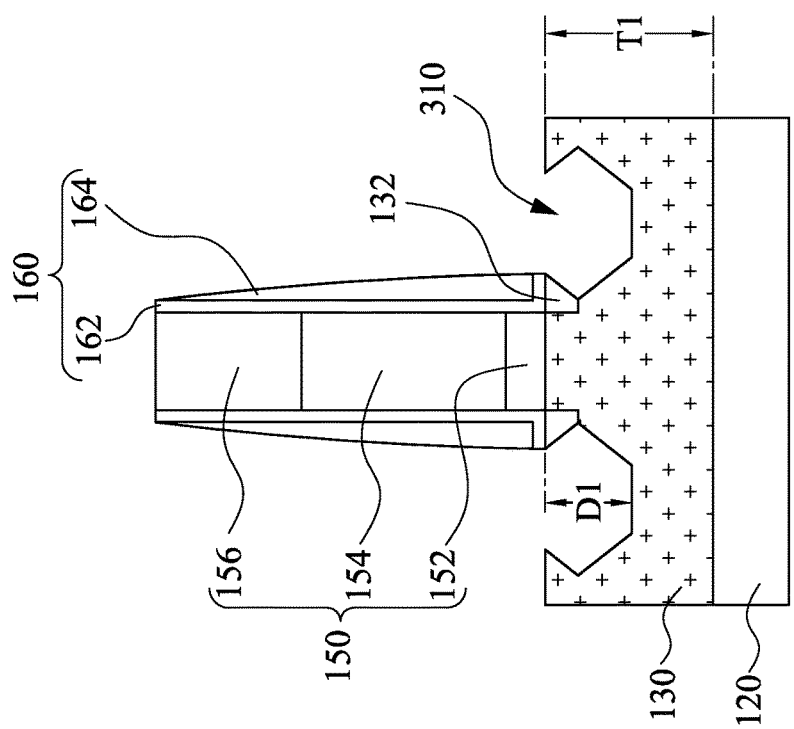

Continuing in FIG. 2E, a recess 310 having a depth D1 is formed in the strain-inducing layer 130. Specifically, the strain-inducing layer 130 is removed from a top surface to form the recess 310, and the depth D1 of the recess 310 is less than the thickness T1 of the strain-inducing layer 130 to avoid breaking the rearrangement of atoms at the interface between the strain-inducing layer 130 and the substrate 110. In some embodiment, the recess 310 is formed by a wet etching process or/and a dry etching process. The dry and wet etching processes have etching parameters which could be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etching gasses include $CF_4$, $NF_3$, $SF_6$, and He. Dry etching may also be performed anisotropically using such mechanisms as DRIE (deep reactive-ion etching).

In FIG. 2F, an epitaxy structure 140 is grown in and filled the recess 310. Since the depth D1 of the recess 310 is less than the thickness T1 of the strain-inducing layer 130, the epitaxy structure 140 is not in contact with the interface between the strain-inducing layer 130 and the substrate 110 to avoid lose of strain. In some embodiments, the epitaxy structure 140 and the strain-inducing layer 130 are both formed of silicon germanium, and the strain-inducing layer 130 described in FIG. 2B is formed with a sufficient germanium percentage to provide a strain effect. Then, the epitaxy structure 140 having a germanium percentage greater than that of the strain-inducing layer 130 is formed in the recess 310 to further increase the strain effect. In some embodiments, the silicon germanium of the strain-inducing layer 130 has a germanium percentage in a range from about 30 to about 50%, and the silicon germanium of the epitaxy structure 140 has a germanium percentage greater than about 50%.

In some embodiments, the epitaxy structure 140 is grown in the recess 310 by an epitaxy process using a Si-containing gas (e.g., silane or dichlorosilane (DCS)), a Ge-containing gas (e.g., $GeH_4$, $GeCl_4$), a B(boron)-containing gas (e.g., $B_2H_6$), a carrier gas (e.g., $H_2$), and/or a selective etching gas (e.g., HCl). The epitaxy process is performed under a temperature ranging between about 500° C. and about 800° C., and under a pressure ranging between about 10 Torr and about 100 Torr.

In some embodiments, a cap layer 142 is formed on the epitaxy structure 140 to protect the epitaxy structure 140 from damage during the subsequent exposing and etching process. The cap layer 142 is also formed of silicon germanium using the technique similar to epitaxy structure 140 and the strain-inducing layer 130, and the silicon germanium of the epitaxy structure 140 is higher than the silicon germanium of the cap layer 142 in germanium percentage. In various embodiments, the silicon germanium of the cap layer 142 has a germanium percentage in a range from about 20 to about 50%.

Figure 3A:
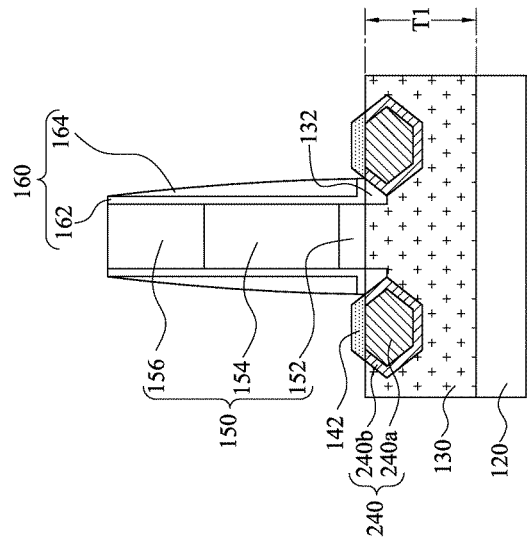
FIGS. 3A and 3B are cross-sectional views of the semiconductor structure in FIG. 1C at an intermediate stage of fabrication, in accordance with various embodiments.
Figure 3B:
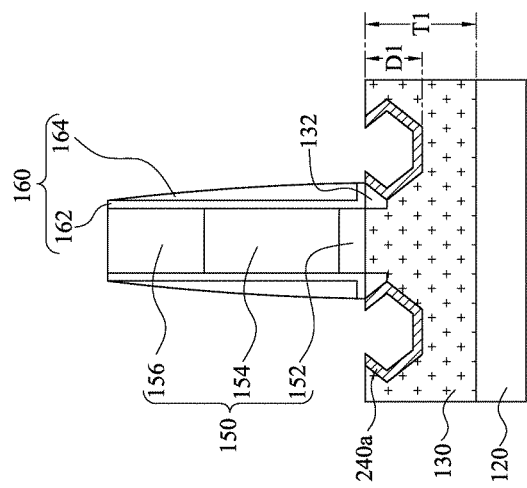

Referring to FIGS. 3A and 3B, FIGS. 3A and 3B are cross-sectional views of the semiconductor structure 200 in FIG. 1C at an intermediate stage of fabrication, in accordance with various embodiments. Specifically, FIGS. 3A and 3B are cross-sectional views in next stages after forming the recess 310 shown in FIG. 2E. In FIG. 3A, after forming the recess 310 having a depth D1, a second portion 240b of an epitaxy structure 240 is formed to cover the sidewalls and a bottom of the recess. The second portion 240b functions as a buffer layer to prevent or reduce defects formed between the strain-inducing layer 130 and the second portion 240b, therefore the second portion 240b prevents strain relaxation and dislocation between second portion 240b and the strain-inducing layer 130.

Continuing in FIG. 3B, a first portion 240a is formed to fill the recess 310 and complete the preparation of the epitaxy structure 240. In some embodiments, the epitaxy structure 240 and the strain-inducing layer 130 are both formed of silicon germanium. The silicon germanium of the second portion 240b of the epitaxy structure 240 is higher than the silicon germanium of the strain-inducing layer 130 in germanium percentage, and the silicon germanium of the first portion 240a of the epitaxy structure 240 is higher than the silicon germanium of the second portion 240b of the epitaxy structure 240 in germanium percentage. In other words, the germanium percentage of the second portion 240b is between that of the first portion 240a and the strain-inducing layer 130. As such, the second portion 240b buffers the lattice mismatch between the first portion 240a and the strain-inducing layer 130, so as to prevent current leakage during the operation of the semiconductor structure 200. In various embodiments, the second portion 240b of the epitaxy structure 240 is lower than the silicon germanium of the strain-inducing layer 130 in germanium percentage.

In various embodiments, the first portion 240a and second portion 240b of the epitaxy structure 240 are grown in the recess 310 by an epitaxy process using a Si-containing gas (e.g., silane or dichlorosilane (DCS)), a Ge-containing gas (e.g., $GeH_4$, $GeCl_4$), a B(boron)-containing gas (e.g., $B_2H_6$), a carrier gas (e.g., $H_2$), and/or a selective etching gas (e.g., HCl). The epitaxy process is performed under a temperature ranging between about 500° C. and about 800° C., and under a pressure ranging between about 10 Torr and about 100 Torr.

In some embodiments, the cap layer 142 is formed on the epitaxy structure 240 to protect the epitaxy structure 240 from damage during the subsequent exposing and etching process. The cap layer 142 is also formed of silicon germanium using the technique similar to epitaxy structure 240 and the strain-inducing layer 130, and the silicon germanium of first portion 240a of the epitaxy structure 240 is higher than the silicon germanium of the cap layer 142 in germanium percentage. In various embodiments, the silicon germanium of the cap layer 142 has a germanium percentage in a range from about 20 to about 50%.

The embodiments of the present disclosure discussed above have advantages over existing methods and structures, and the advantages are summarized below. According to some embodiments, an improved structure is provided having an epitaxy structure embedded in a strain-inducing layer and not in contact with the substrate, to avoid the epitaxy structure breaking the rearrangement of the atoms at an interface between the strain-inducing layer and the substrate. Therefore, loss of strain in the strain-inducing layer is prevented to maintain the excellent carrier mobility in the strain-inducing layer. In some other embodiments, the epitaxy structure is a bi-layer structure having a buffer layer to prevent strain relaxation and dislocation between epitaxy structure and the strain-inducing layer, and therefore the performance of the semiconductor structure is further increased. Summarize above points, improved method and/or structure is provided to maintain the strain in the strain-inducing layer, so as to increase the performance of the semiconductor structure.

In accordance with some embodiments, the present disclosure discloses a semiconductor structure including a substrate, a strain-inducing layer and an epitaxy structure. The strain-inducing layer is disposed on the substrate, and the epitaxy structure is embedded in the strain-inducing layer and not in contact with the substrate.

In accordance with various embodiments, the present disclosure discloses a semiconductor structure including a fin structure, a germanium-containing layer, a gate structure and two epitaxy structures. The fin structure is formed from a silicon substrate, and the germanium-containing layer is disposed on the fin structure. The gate structure is across the fin structure and the germanium-containing layer, and the two epitaxy structures are embedded in the germanium-containing layer and above an interface between the fin structure and the germanium-containing layer, which the two epitaxy structures are interposed by the gate structure In accordance with various embodiments, the present disclosure discloses method of fabricating a semiconductor structure, and the method includes following steps. A strain-inducing layer is formed on a substrate, and a recess is formed in the strain-inducing layer, which a depth of the recess is less than a thickness of the strain-inducing layer. Then, an epitaxy structure is grown in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a strain-inducing layer disposed on the substrate;
a gate dielectric layer disposed on the strain-inducing layer, wherein the gate dielectric layer and the strain-inducing layer are in contact;
a gate electrode disposed on the gate dielectric layer; and
an epitaxy structure embedded in the strain-inducing layer and not in contact with the substrate, wherein a portion of the strain-inducing layer is disposed between the epitaxy structure and the substrate.

2. The semiconductor structure of claim 1, wherein the strain-inducing layer and the epitaxy structure comprises germanium (Ge), silicon germanium (SiGe), or a combination thereof.

3. The semiconductor structure of claim 2, wherein the strain-inducing layer and the epitaxy structure are formed of silicon germanium.

4. The semiconductor structure of claim 3, wherein the silicon germanium of the epitaxy structure is higher than the silicon germanium of the strain-inducing layer in germanium percentage.

5. The semiconductor structure of claim 3, further comprising a cap layer on the epitaxy structure.

6. The semiconductor structure of claim 5, wherein the cap layer is formed of silicon germanium, and the silicon germanium of the epitaxy structure is higher than the silicon germanium of the cap layer in germanium percentage.

7. The semiconductor structure of claim 3, wherein the epitaxy structure is a bi-layer structure, comprising:
a first portion; and
a second portion surrounding the first portion and in contact with the strain-inducing layer, and the silicon germanium of the first portion is higher than the silicon germanium of the second portion in germanium percentage.

8. The semiconductor structure of claim 3, wherein the silicon germanium of the epitaxy structure is gradiently increased in germanium percentage from an interface between the epitaxy structure and the strain-inducing layer to a top surface of the epitaxy structure.

9. The semiconductor structure of claim 1, wherein a thickness of the epitaxy structure is in a range from about 50% to 80% of a thickness of the strain-inducing layer.

10. The semiconductor structure of claim 9, wherein the thickness of the strain-inducing layer is in a range from about 40 nm to about 60 nm.

11. The semiconductor structure of claim 9, wherein the thickness of the epitaxy structure is in a range from about 20 nm to about 50 nm.

12. The semiconductor structure of claim 1, wherein the strain-inducing layer is stretched or compressed in view of the substrate.

13. The semiconductor structure of claim 1, wherein the substrate and the strain-inducing layer are formed of different materials having different lattice constants.

14. The semiconductor structure of claim 1, wherein the strain-inducing layer comprises lightly doped source/drain (LDD) regions.

15. The semiconductor structure of claim 14, wherein the doped regions are doped with p-type dopants to form p-typed lightly doped source/drain (PLDD) regions, doped with n-type dopants to form n-typed lightly doped source/drain (NLDD) regions, or doped both with p-typed and n-typed dopants to form both PLDD and NLDD regions.

16. The semiconductor structure of claim 1, wherein a thickness of the epitaxy structure is smaller than a thickness of the strain-inducing layer.

17. A semiconductor structure, comprising:
a substrate;
a strain-inducing layer disposed on the substrate;
a gate dielectric layer disposed on the strain-inducing layer, wherein the gate dielectric layer and the strain-inducing layer are in contact;
a gate electrode disposed on the gate dielectric layer; and
an epitaxy structure embedded in the strain-inducing layer, wherein the epitaxy structure is separated from the substrate by a portion of the strain-inducing layer.

18. The semiconductor structure of claim 17, wherein the substrate and the strain-inducing layer have different lattice constants.

19. The semiconductor structure of claim 18, wherein the epitaxy structure comprises silicon germanium, and the silicon germanium of the epitaxy structure is gradiently increased in germanium percentage from an interface between the epitaxy structure and the strain-inducing layer to a top surface of the epitaxy structure.

20. A semiconductor structure, comprising:
a substrate;
a strain-inducing layer disposed on the substrate;
an epitaxy structure embedded in the strain-inducing layer and not in contact with the substrate, wherein the epitaxy structure comprises silicon germanium; and
a cap layer on the epitaxy structure, wherein the cap layer comprises silicon germanium, and the silicon germanium of the epitaxy structure is higher than the silicon germanium of the cap layer in germanium percentage.

* * * * *